United States Patent
Itakura et al.

(10) Patent No.: US 12,283,963 B2
(45) Date of Patent: Apr. 22, 2025

(54) PHASE LOCKED LOOP AND SENSING DEVICE

(71) Applicant: KABUSHIKI KAISHA TOSHIBA, Tokyo (JP)

(72) Inventors: Tetsuro Itakura, Nerima Tokyo (JP); Ryunosuke Gando, Yokohama Kanagawa (JP); Daiki Ono, Yokohama Kanagawa (JP); Akihide Sai, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 411 days.

(21) Appl. No.: 17/930,767

(22) Filed: Sep. 9, 2022

(65) Prior Publication Data

US 2023/0125664 A1  Apr. 27, 2023

(30) Foreign Application Priority Data

Oct. 21, 2021  (JP) ................................. 2021-172484

(51) Int. Cl.
| | |
|---|---|
| H03L 7/099 | (2006.01) |
| G01C 19/567 | (2012.01) |
| H03L 7/085 | (2006.01) |

(52) U.S. Cl.
CPC .......... *H03L 7/0991* (2013.01); *G01C 19/567* (2013.01); *H03L 7/085* (2013.01)

(58) Field of Classification Search
CPC ...... H03L 7/0991; H03L 7/085; G01C 19/567
See application file for complete search history.

(56) References Cited

U.S. PATENT DOCUMENTS

| | | | |
|---|---|---|---|
| 4,951,508 A | 8/1990 | Loper, Jr. et al. | |
| 7,145,402 B2* | 12/2006 | Mattila | ................... H03L 1/026 |
| | | | 331/18 |

(Continued)

FOREIGN PATENT DOCUMENTS

| | | | |
|---|---|---|---|
| CN | 109073381 A | * 12/2018 | ......... G01C 19/5776 |
| EP | 0 592 171 B1 | 11/1998 | |

(Continued)

OTHER PUBLICATIONS

Japan Patent Office, Office Action in JP App. No. 2021-172484, 2 pages, and machine translation, 3 pages (Oct. 4, 2024).

(Continued)

*Primary Examiner* — Adam D Houston
(74) *Attorney, Agent, or Firm* — Finnegan, Henderson, Farabow, Garrett & Dunner, LLP

(57) ABSTRACT

A phase locked loop has an oscillator that varies a frequency according to a control signal, a resonance element that resonates at a predetermined resonance frequency and output a signal obtained by shifting a phase of an output signal of the oscillator by 90 degrees at the resonance frequency, a phase detector that detects a phase error between an output signal of the resonance element and an output signal of the oscillator, a feedback controller that controls a frequency of an output signal of the oscillator by proportional control and integral control according to the phase error, and a control signal corrector that corrects the control signal by adding a correction term corresponding to environment information to an output signal of the feedback controller.

20 Claims, 12 Drawing Sheets

1 : PHASE LOCKED LOOP

(56) References Cited

U.S. PATENT DOCUMENTS

| | | | |
|---|---|---|---|
| 9,166,603 B2* | 10/2015 | Hekmat | H03L 7/06 |
| 10,771,011 B2 | 9/2020 | Uno | |
| 2014/0015615 A1* | 1/2014 | Hekmat | H03L 7/06 |
| | | | 331/2 |
| 2014/0232475 A1* | 8/2014 | Elkholy | H03L 7/16 |
| | | | 331/44 |
| 2015/0276406 A1* | 10/2015 | Rastegar | G01C 19/5712 |
| | | | 73/504.12 |
| 2015/0276407 A1* | 10/2015 | Bhandari | G01C 19/5776 |
| | | | 73/504.12 |
| 2016/0072440 A1* | 3/2016 | Hekmat | H03B 27/00 |
| | | | 331/2 |
| 2017/0328712 A1* | 11/2017 | Collin | H03M 3/458 |
| 2019/0310106 A1* | 10/2019 | Furuta | G01C 19/5776 |
| 2022/0173740 A1* | 6/2022 | Van Elzakker | H03L 1/02 |
| 2022/0326013 A1 | 10/2022 | Miyazaki et al. | |
| 2023/0125664 A1* | 4/2023 | Itakura | H03L 7/0991 |
| | | | 73/326 |
| 2023/0253972 A1* | 8/2023 | Itakura | H03L 7/00 |
| | | | 375/376 |
| 2024/0214747 A1* | 6/2024 | Niederberger | H04R 3/06 |

FOREIGN PATENT DOCUMENTS

| | | | | |
|---|---|---|---|---|
| JP | H6-281661 A | | 10/1994 | |
| JP | 2008-256582 A | | 10/2008 | |
| JP | 2015091084 A | * | 5/2015 | |
| JP | 2016-220157 A | | 12/2016 | |
| JP | 2017223659 A | * | 12/2017 | B81B 7/02 |
| JP | 2019-193052 A | | 10/2019 | |
| JP | 2022-162641 A | | 10/2022 | |
| KR | 20200123600 A | * | 10/2020 | |
| KR | 20220134326 A | * | 10/2022 | |
| NL | 2007682 C2 | * | 5/2013 | |
| WO | WO 2009/037499 A1 | | 3/2009 | |
| WO | WO-2013066160 A1 | * | 5/2013 | H03L 7/02 |
| WO | WO-2013066161 A1 | * | 5/2013 | H03B 27/00 |
| WO | WO-2017195020 A1 | * | 11/2017 | G01C 19/5776 |
| WO | WO-2020219215 A1 | * | 10/2020 | G02B 26/0833 |

OTHER PUBLICATIONS

Japan Patent Office, Decision to Grant a Patent in JP App. No. 2021-172484, 1 page, with machine translation, 2 pages (Dec. 13, 2024).

* cited by examiner

PHASE LOCKED LOOP AND SENSING DEVICE

CROSS REFERENCE TO RELATED APPLICATIONS

This application is based upon and claims the benefit of priority from the prior Japanese Patent Application No. 2021-172484, filed on Oct. 21, 2021, the entire contents of which are incorporated herein by reference.

FIELD

An embodiment of the present invention relates to a phase locked loop and a sensing device.

BACKGROUND

A phase locked loop is known which performs feedback control such that the oscillation frequency of a variable-frequency oscillator does not change even when the resonance frequency of a resonance element changes due to environmental conditions such as a temperature.

However, it is practically difficult to accurately change the oscillation frequency by following the change in the resonance frequency due to the environmental conditions such as a temperature, and a frequency error between the oscillation frequency and the resonance frequency occurs. For this reason, in a physical quantity detection sensor using this type of phase locked loop, the detection accuracy of a physical quantity decreases due to the frequency error between the oscillation frequency and the resonance frequency.

DETAILED DESCRIPTION

According to one embodiment, a phase locked loop has:
an oscillator that varies a frequency according to a control signal;
a resonance element that resonates at a predetermined resonance frequency and output a signal obtained by shifting a phase of an output signal of the oscillator by 90 degrees at the resonance frequency;
a phase detector that detects a phase error between an output signal of the resonance element and an output signal of the oscillator;
a feedback controller that controls a frequency of an output signal of the oscillator by proportional control and integral control according to the phase error; and
a control signal corrector that corrects the control signal by adding a correction term corresponding to environment information to an output signal of the feedback controller.

Hereinafter, embodiments of a phase locked loop and a sensing device will be described with reference to the drawings. Although main components of the phase locked loop and the sensing device will be mainly described below, the phase locked loop and the sensing device may have components and functions that are not illustrated or described. The following description does not exclude components and functions that are not illustrated or described.

First Embodiment

Figure 1:
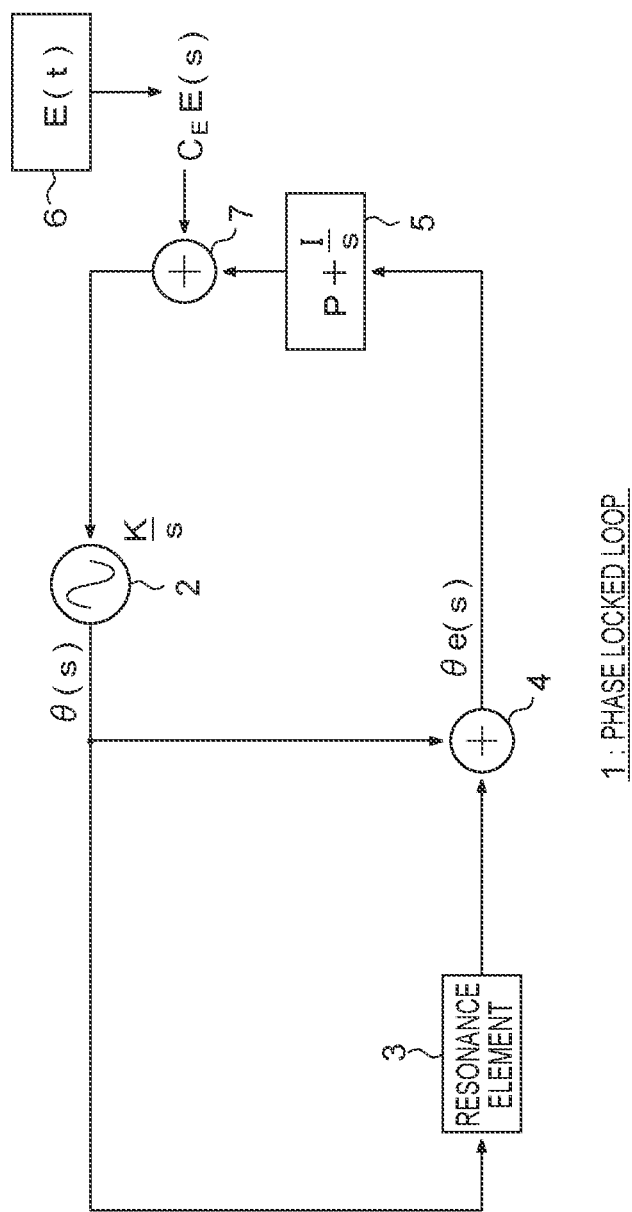
FIG. 1 is a block diagram of a phase locked loop according to a first embodiment.
Figure 2:
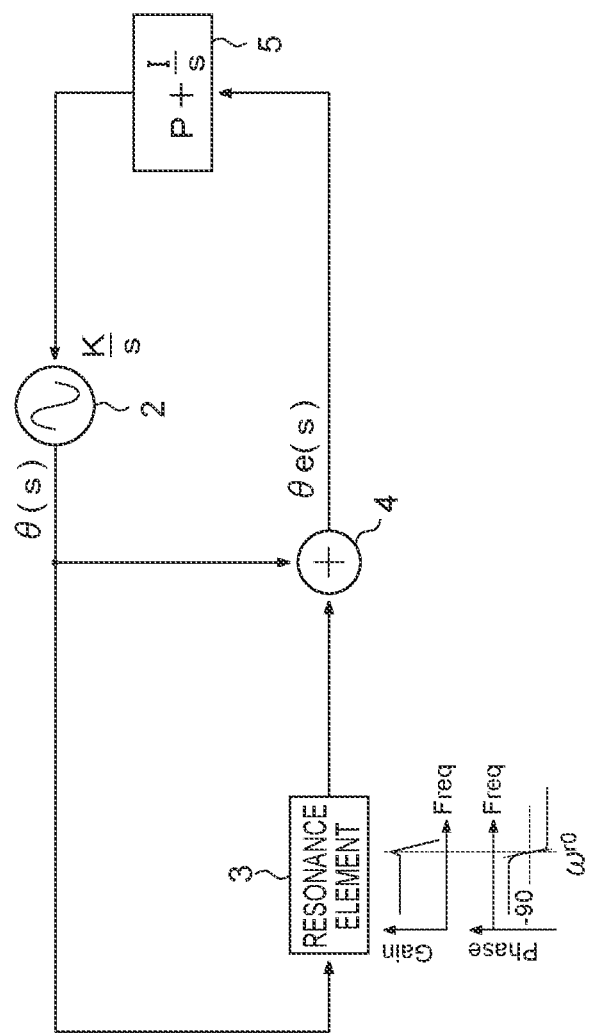
FIG. 2 is a block diagram of a phase locked loop according to a comparative example.

FIG. 1 is a block diagram of a phase locked loop 1 according to a first embodiment, and FIG. 2 is a block diagram of a phase locked loop 100 according to a comparative example. First, the operation principle of the phase locked loop 1 will be described using the phase locked loop 100 according to a comparative example of FIG. 2.

The phase locked loop 100 of FIG. 2 includes a variable-frequency oscillator 2, a resonance element 3, a phase detector 4, and a feedback controller 5.

The variable-frequency oscillator 2 generates an oscillation signal having a variable frequency. More specifically, the variable-frequency oscillator 2 controls the frequency of the oscillation signal on the basis of the control signal output from the feedback control unit 5. The variable-frequency oscillator 2 generates the oscillation signal having a frequency obtained by multiplying the control signal by a frequency conversion coefficient K.

In FIG. 2, a phase signal obtained by Laplace transforming the phase of the output signal (oscillation signal) of the variable-frequency oscillator 2 is denoted as θ(s). The output signal of the variable-frequency oscillator 2 is input to the resonance element 3. The resonance element 3 has a steep Q at the resonance frequency, and the phase is delayed by 90 degrees at the resonance frequency. More specifically, the resonance element 3 resonates at a predetermined resonance frequency, and outputs a signal in which the phase of the output signal of the variable-frequency oscillator is shifted by 90 degrees at the resonance frequency.

When the frequency of the output signal of the variable-frequency oscillator 2 deviates from the resonance frequency of the resonance element 3, the phase delay in the resonance element 3 deviates from 90 degrees. Assuming that a phase error signal obtained by Laplace transforming a phase error which is the deviation component is defined as θe(s) and that a signal obtained by Laplace transforming the phase of the output signal of the variable-frequency oscillator 2 is defined as θ(s), a phase signal obtained by Laplace transforming the phase of the output signal of the resonance element 3 becomes θ(s)−90°/s−θe(s).

The phase detector 4 detects a phase error between the phase of the output signal of the variable-frequency oscillator 2 and the phase of the output signal of the resonance element 3. When a difference is obtained between the phase signal θ(s) obtained by Laplace transforming the phase of the output signal of the variable-frequency oscillator 2 and the phase signal θ(s)−90°/s−θe(s) obtained by Laplace transforming the phase of the output signal of the resonance element 3, the phase error becomes 90°/s+θe(s). When an oscillation signal having a phase shifted by 90 degrees is generated in advance from the variable-frequency oscillator 2 and input to the phase detector 4, the phase error detected by the phase detector 4 becomes θe(s).

The feedback control unit 5 generates a control signal by performing proportional control (also referred to as P control) and integral control (also referred to as I control) according to the phase error detected by the phase detector 4. The feedback control unit 5 can be configured by a filter having a proportional term P and an integral term I.

The variable-frequency oscillator 2 generates an oscillation signal having a frequency obtained by multiplying the control signal output from the feedback control unit 5 by the frequency conversion coefficient K. The frequency conversion coefficient K is a coefficient unique to the variable-frequency oscillator 2. In FIG. 2 or the like, since the output signal of the variable-frequency oscillator 2 is expressed by a phase, the variable-frequency oscillator 2 is expressed as K/s in order to integrate the frequency into the phase.

In a case where the oscillation frequency of the variable-frequency oscillator 2 is close to the resonance frequency of the resonance element 3, the phase characteristic in the vicinity of the resonance frequency of the resonance element 3 can be linearly approximated, and as shown in Equation (1), the phase error θe(s) can be expressed by a value obtained by multiplying a difference between the oscillation frequency of the variable-frequency oscillator 2 and the resonance frequency of the resonance element 3 by a coefficient a.

$$\theta e(s) = -a(s\theta(s) - \omega r(s)) \tag{1}$$

Here, since the output frequency of the variable-frequency oscillator 2 may be obtained by differentiating the phase θ(s), the output frequency can be expressed as sθ(s) by multiplying s in Laplace notation. ωr(s) is obtained by Laplace transforming the resonance frequency ωr(t) of the resonance element 3 which changes with time according to the temporal change of environment. Therefore, when a frequency error between the oscillation frequency of the variable-frequency oscillator 2 and the resonance frequency of the resonance element 3 is Laplace transformed, the frequency error is expressed by sθ(s)−ωr(s). From FIG. 2, the output signal θ(s) of the variable-frequency oscillator 2 is expressed by following Equation (2).

$$\theta(s) = \theta_e(s)\left(P + \frac{I}{s}\right)\frac{K}{s} = \frac{\theta_e(s)(sP+I)K}{s^2} \tag{2}$$

From Equations (1) and (2), the output signal θ(s) of the variable-frequency oscillator 2 is expressed by following Equation (3).

$$\theta(s) = \frac{a\omega_r(s)(sP+I)K}{s\{s(1+aKP)+aKI\}} \tag{3}$$

From Equation (3), the frequency error sθ(s)−ωr(s) between the oscillation frequency of the variable-frequency oscillator 2 and the resonance frequency of the resonance element 3 is expressed by following Equation (4).

$$s\theta(s) - \omega_r(s) = \frac{-s\omega_r(s)}{s(1+aKP)+aKI} \tag{4}$$

The resonance frequency of the resonance element 3 changes according to environment information E(t), and can be expressed as ωr(t)=ωr(E(t)). For example, when the environment information E(t) is a temperature T(t), the resonance frequency ωr(t) is expressed as ωr(t)=ωr(T(t)). When a resonance frequency at a predetermined temperature T0 is ωr0 and the temperature coefficient of the resonance frequency is $K_T$, the resonance frequency ωr(t) is expressed by following Equation (5).

$$\omega r(t) = \omega r(T(t)) = \omega r0 + K_T(T(t) - T0) \tag{5}$$

When Laplace transform is performed on Equation (5), Equation (6) is obtained.

$$\omega r(s) = \omega r(T(s)) = \omega r0/s + K_T(T(s) - T0/s) \tag{6}$$

Since $K_T T0 = \omega r0$, when this is substituted into Equation (6), ωr(s)=$K_T$T(s) is obtained. When this is substituted into Equation (4), Equation (7) is obtained.

$$s\theta(s) - \omega_r(s) = \frac{-sK_T T(s)}{s(1+aKP)+aKI} \tag{7}$$

From Equation (7), it can be seen that when the temperature changes with time, the oscillation frequency of the variable-frequency oscillator 2 cannot follow the change in the resonance frequency, and a phase error according to the temperature occurs.

In this regard, the phase locked loop 1 of FIG. 1 is characterized in that the phase error illustrated in Equation (7) is set to zero. The phase locked loop 1 of FIG. 1 includes an environment information acquisition unit 6 and a control signal correction unit 7 in addition to the configuration of the phase locked loop 100 of FIG. 2.

The environment information acquisition unit 6 acquires the environment information E(t). As described above, the environment information E(t) is a temperature, a power supply voltage, or the like that changes with time, and can be detected by a temperature sensor, a voltage sensor, or the like. A sensor or the like that detects the environment information E(t) may be built in the phase locked loop 1. In this case, the environment information acquisition unit 6 may also serve as an environment information detection unit. Alternatively, the environment information acquisition unit 6 may acquire the environment information detected by a sensor or the like provided separately from the phase locked loop 1.

The control signal correction unit 7 of FIG. 1 corrects the control signal by adding a correction term corresponding to the environment information such as a temperature to the control signal output from the feedback control unit 5. The control signal corrected by the control signal correction unit 7 is input to the variable-frequency oscillator 2.

The correction term input to the control signal correction unit 7 is a value $C_E \cdot E(s)$ obtained by multiplying E(s) obtained by Laplace transforming the environment information E(t) by a predetermined coefficient (referred to as an environment dependence coefficient in the present specification) $C_E$. The environment dependence coefficient $C_E$ has a fixed value corresponding to the environment information E(t). The control signal correction unit 7 corrects the control signal by adding the control signal output from the feedback control unit 5 by the correction term $C_E \cdot E(s)$. The calculation of the correction term $C_E \cdot E(s)$ may be performed by the environment information acquisition unit 6 or may be performed by the control signal correction unit 7.

The variable-frequency oscillator 2 controls the frequency of the output signal of the variable-frequency oscillator 2 by multiplying the control signal output from the control signal correction unit 7 by the frequency conversion coefficient K/s.

Assuming that the environment information coefficient of the resonance frequency of the resonance element 3 in FIG. 1 is $K_E$, the frequency error $s\theta(s)-\omega r(s)$ between the oscillation frequency of the variable-frequency oscillator 2 and the resonance frequency of the resonance element 3 is expressed by following Equation (8).

$$s\theta(s) - \omega_r(s) = \frac{-sK_E E(s) + sKC_E E(s)}{s(1 + aKP) + aKI} \quad (8)$$

When the numerator on the right side of Equation (8) becomes zero, the phase error detected by the phase detector 4 of FIG. 1 becomes zero and does not depend on the environment information E(t). The numerator on the right side of Equation (8) becomes zero in a case where following Equation (9) is established.

$$C_E = \frac{K_E}{K} \quad (9)$$

As shown in Equation (9), when the environment dependence coefficient $C_E$ is represented by a ratio between the environment information coefficient $K_E$ and the frequency conversion coefficient K of the variable-frequency oscillator 2, the numerator of Equation (8) becomes zero, and even when there is a temporal change in the environment information E(t), the frequency of the variable-frequency oscillator 2 of the phase locked loop 1 according to the present embodiment can follow the resonance frequency of the resonance element 3.

Note that, even when the environment dependence coefficient $C_E$ slightly deviates from the value defined by Equation (9), an effect of reducing the frequency error between the oscillation frequency of the variable-frequency oscillator 2 and the resonance frequency of the resonance element 3 can be obtained.

Figure 3:
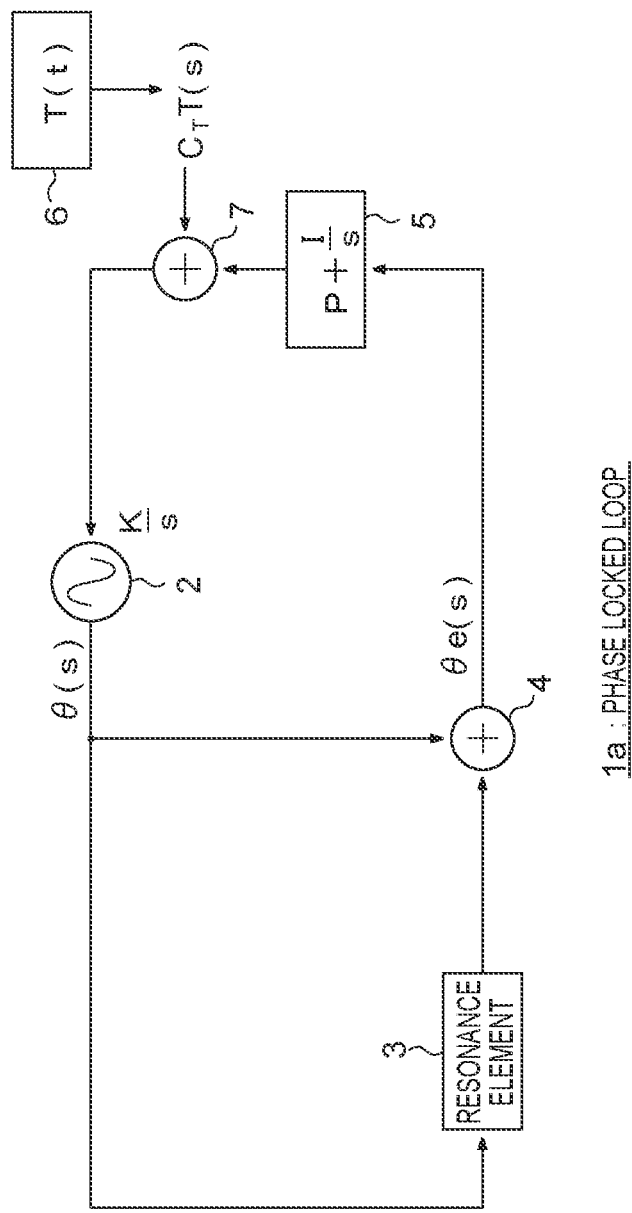
FIG. 3 is a block diagram of a phase locked loop according to a first modification of FIG. 1.

The environment information may be temperature information. FIG. 3 is a block diagram of a phase locked loop 1a according to a first modification of FIG. 1, and illustrates an example in which a correction term based on the temperature information is input to the control signal correction unit 7. The phase locked loop 1a of FIG. 3 has the same block configuration as the phase locked loop 1 of FIG. 1 except that the correction term input to the control signal correction unit 7 is different.

The correction term input to the control signal correction unit 7 in FIG. 3 is a value $C_T \cdot T(s)$ obtained by multiplying T(s) obtained by Laplace transform of the temperature information T(t) by a predetermined environment dependence coefficient $C_T$. The control signal is corrected by adding the correction term $C_T \cdot T(s)$ to the control signal output from the feedback control unit 5. Assuming that the temperature information coefficient of the resonance frequency of the resonance element 3 in FIG. 3 is $K_T$, the frequency error $s\theta(s)-\omega r(s)$ between the oscillation frequency of the variable-frequency oscillator 2 and the resonance frequency of the resonance element 3 is expressed by following Equation (10).

$$s\theta(s) - \omega_r(s) = \frac{-sK_T T(s) + sKC_T T(s)}{s(1 + aKP) + aKI} \quad (10)$$

When the numerator on the right side of Equation (10) becomes zero, the phase error detected by the phase detector 4 in FIG. 3 becomes zero and does not depend on the temperature information. The numerator on the right side of Equation (10) becomes zero in a case where following Equation (11) is established.

$$C_T = \frac{K_T}{K} \quad (11)$$

Figure 4:
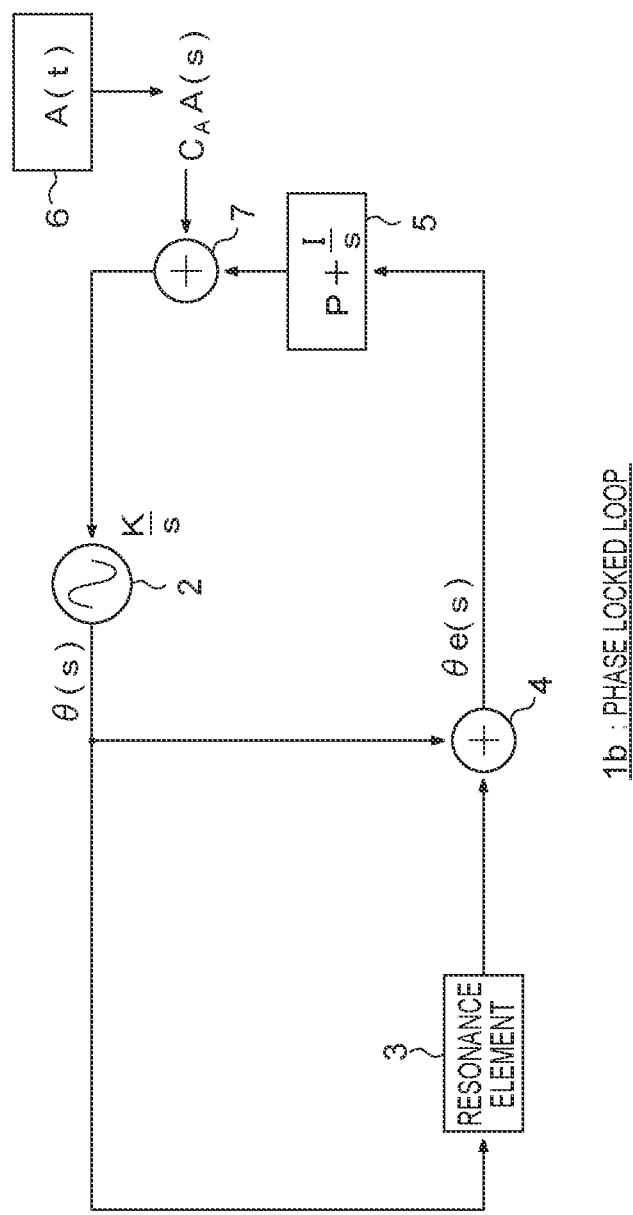
FIG. 4 is a block diagram of a phase locked loop according to a second modification of FIG. 1.

On the other hand, in a case where the resonance element 3 is a micro electro mechanical systems (MEMS) resonance element, the environment information may be acceleration since the resonance frequency of the resonance element 3 changes by an acceleration. FIG. 4 is a block diagram of a phase locked loop 1b according to a second modification of FIG. 1, and illustrates an example in which a correction term based on the acceleration is input to the control signal correction unit 7. The phase locked loop 1b of FIG. 4 has a block configuration common to the phase locked loop 1 of FIG. 1 except that the correction term input to the control signal correction unit 7 is different.

In the correction term input to the control signal correction unit 7 in FIG. 4, the control signal is corrected by multiplying a value $C_A \cdot A(s)$ obtained by multiplying A(s) obtained by Laplace transforming the acceleration A(t) by a predetermined environment dependence coefficient $C_A$. Assuming that the acceleration coefficient of the resonance frequency of the resonance element 3 in FIG. 4 is $K_A$, the frequency error $s\theta(s)-\omega r(s)$ between the oscillation frequency of the variable-frequency oscillator 2 and the resonance frequency of the resonance element 3 is expressed by following Equation (12).

$$s\theta(s) - \omega_r(s) = \frac{-sK_A A(s) + sKC_A A(s)}{s(1 + aKP) + aKI} \cdots \quad (12)$$

When the numerator on the right side of Equation (12) becomes zero, the phase error detected by the phase detector 4 in FIG. 3 becomes zero and does not depend on the acceleration. The numerator on the right side of Equation (12) becomes zero in a case where following Equation (13) is established.

$$C_A = \frac{K_A}{K} \quad (13)$$

FIGS. 1, 3, and 4 illustrate an example in which the phase detector 4 in the phase locked loop 1, 1a, or 1b detects the phase error between the oscillation frequency of the variable-frequency oscillator 2 and the resonance frequency of the resonance element 3 by using the control signal correction unit 7. The phase detector 4 can also be configured by using a multiplier and a low-pass filter.

Figure 5:
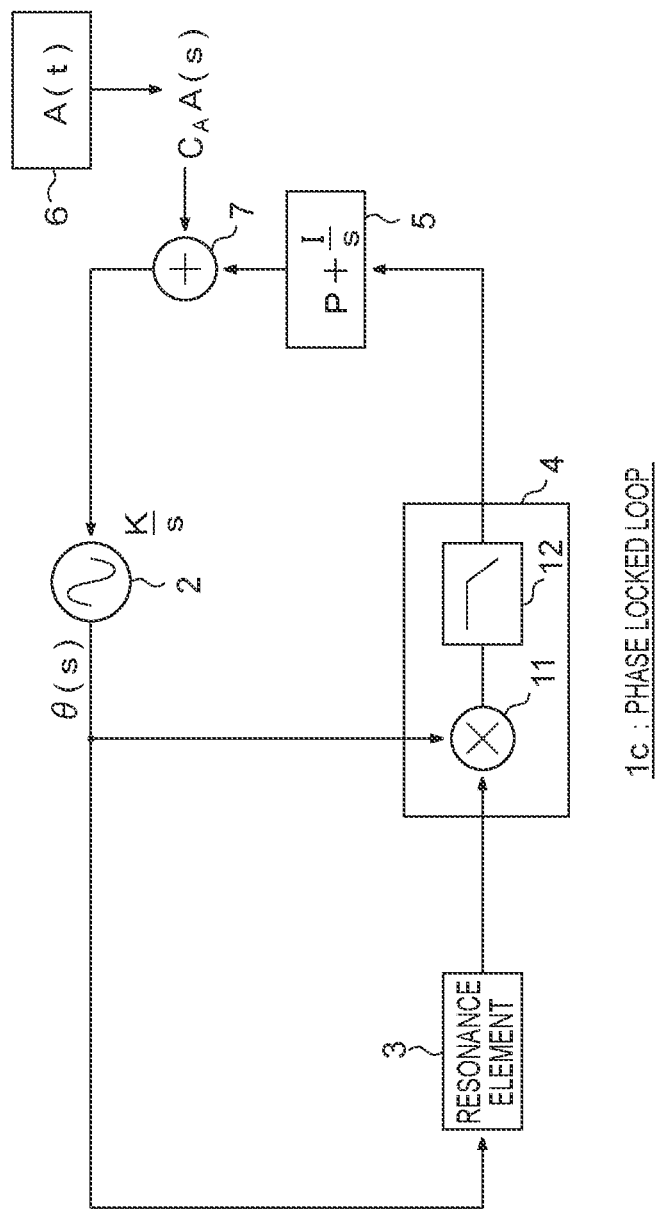
FIG. 5 is a block diagram of a phase locked loop according to a third modification of FIG. 1.

FIG. 5 is a block diagram of a phase locked loop 1c according to a third modification of FIG. 1. The phase locked loop 1c of FIG. 5 is different from the phase locked loop 1 of FIG. 1 in the internal configuration of the phase detector 4. The phase detector 4 of FIG. 5 includes a multiplier 11 and a low-pass filter 12.

In a case where the output signal of the variable-frequency oscillator 2 is cos θ(t), the output signal of the resonance element 3 is expressed by following Equation (14).

$$\cos\left(\theta(t) - \frac{\pi}{2} + \theta_e(t)\right) = \sin(\theta(t) + \theta_e(t)) \tag{14}$$

When the output signal of the variable-frequency oscillator 2 and the output signal of the resonance element 3 are multiplied by the multiplier 11, the signal expressed by following Equation (15) is generated.

$$\sin(\theta(t) + \theta_e(t))\cos\theta(t) = \frac{1}{2}\{\sin(2\theta(t) + \theta_e(t)) + \sin\theta_e(t)\} \tag{15}$$

When the output signal of the multiplier 11 is input to the low-pass filter 12, a phase error θe(t) expressed by following Equation (16) is obtained.

$$\frac{1}{2}\sin\theta_e(t) \approx \theta_e(t)/2 \tag{16}$$

The variable-frequency oscillator 2 may supply two oscillation signals having phases different from each other by 90 degrees to the phase detector 4 separately from the oscillation signal supplied to the resonance element 3, and may generate an I signal and a Q signal by multiplying each of the two oscillation signals and the output signal of the resonance element 3.

Figure 6:
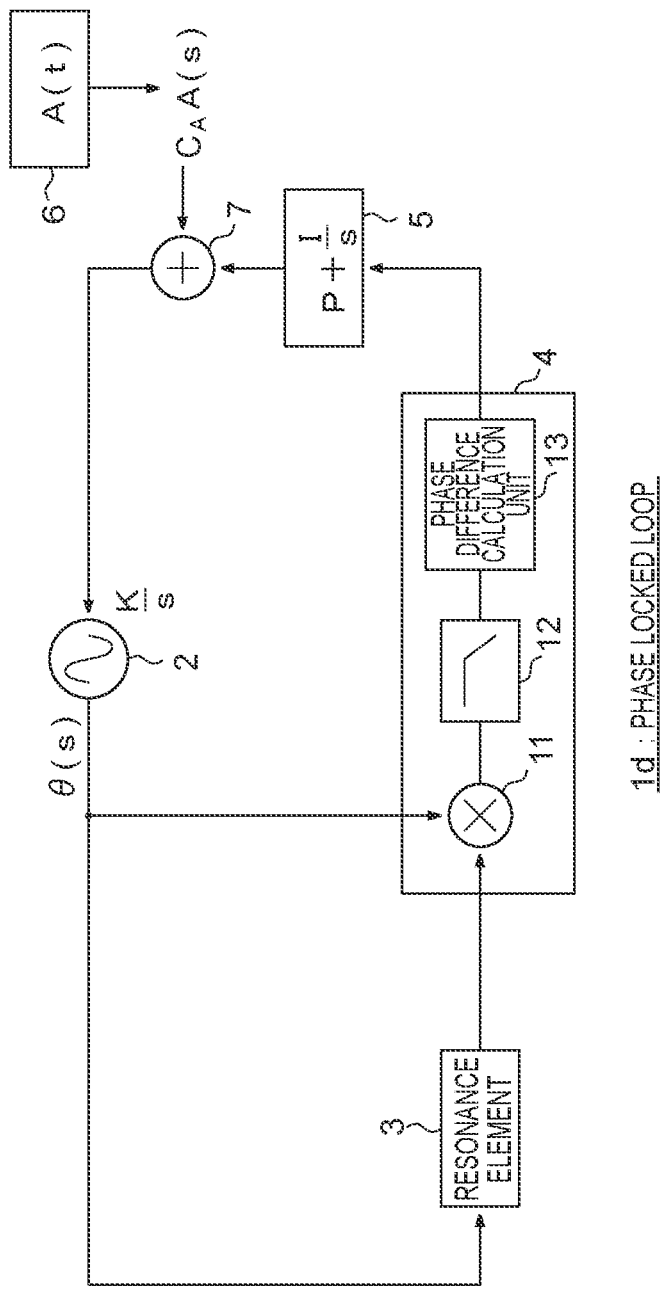
FIG. 6 is a block diagram of a phase locked loop according to a fourth modification of FIG. 1.

FIG. 6 is a block diagram of a phase locked loop 1d according to a fourth modification of FIG. 1. The phase detector 4 in the phase locked loop 1d of FIG. 6 includes the multiplier 11, the low-pass filter 12, and a phase difference calculation unit 13.

The variable-frequency oscillator 2 of FIG. 6 supplies cos θ(t) among a plurality of oscillation signals having phases different by 90 degrees to the resonance element 3. An output signal x of the resonance element 3 is expressed by following Equation (17).

$$x = \cos\left(\theta(t) - \frac{\pi}{2} + \theta_e(t)\right) = \sin(\theta(t) + \theta_e(t)) \tag{17}$$

The multiplier 11 in the phase detector 4 multiplies the signal x of Equation (17) by each of two oscillation signals (2 sin θ(t), −2 cos θ(t)) having phases different from each other by 90 degrees to generate the I signal and the Q signal shown in following Equation (18).

$$I = x(2 \sin \theta(t)), Q = x(-2 \cos \theta(t)) \tag{18}$$

The low-pass filter 12 in the phase detector 4 extracts low-pass components $I_L$ and $Q_L$ included in the output signal of the multiplier 11 as expressed in Equation (19).

$$I_L = \cos \theta_e(t), Q_L = \sin \theta_e(t) \tag{19}$$

As shown in Equation (20), the phase difference calculation unit 13 calculates a phase error ee by an angle formed by $I_L$ and $Q_L$ in an IQ plane.

$$\theta_e = \tan^{-1}\frac{Q_L}{I_L} = \tan^{-1}\frac{\sin\theta_e(t)}{\cos\theta_e(t)} \tag{20}$$

Figure 7:
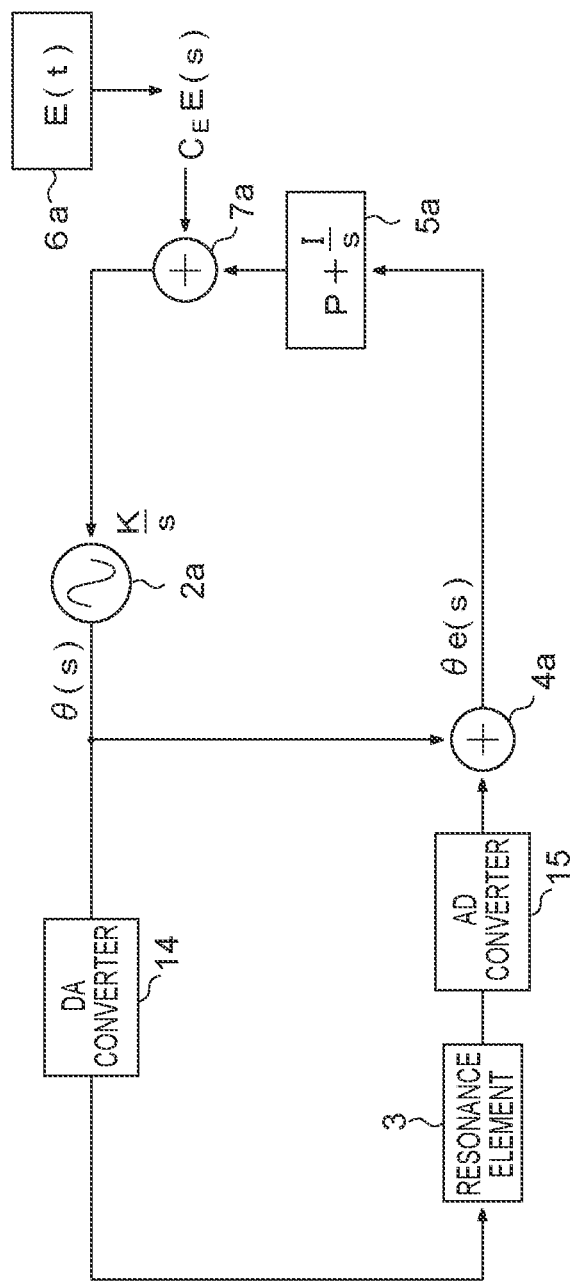
FIG. 7 is a block diagram of a phase locked loop according to a fifth modification of FIG. 1.

The phase locked loop 1 according to FIGS. 1 to 6 described above performs feedback control by an analog signal. An analog signal is easily affected by environment such as a temperature. In this regard, feedback control by a digital signal may be performed. FIG. 7 is a block diagram of a phase locked loop 1e according to a fifth modification of FIG. 1.

A variable-frequency oscillator 2a, a phase detector 4a, a feedback control unit 5a, an environment information acquisition unit 6a, and a control signal correction unit 7a in FIG. 7 are all configured by a digital circuit. Only the resonance element 3 in FIG. 7 is an analog circuit. The output signal of the variable-frequency oscillator 2a, the output signal of the feedback control unit 5a, the correction term input to the control signal correction unit 7a, and the control signal generated by the control signal correction unit 7a are all digital signals.

The phase locked loop 1e of FIG. 7 includes a DA converter 14 and an AD converter 15 in addition to the configuration of FIG. 1. Hereinafter, the output signal of the variable-frequency oscillator 2a is referred to as a digital oscillation signal.

The DA converter 14 converts the digital oscillation signal output from the variable-frequency oscillator 2a into an analog oscillation signal. Similarly to FIG. 1, the resonance element 3 performs an analog resonance operation and outputs an analog signal. The AD converter 15 converts the output signal of the resonance element 3 into a digital signal. Hereinafter, the output of the AD converter 15 is referred to as a digital resonance signal.

The phase detector 4a detects a phase error between the digital oscillation signal output from the variable-frequency oscillator 2a and the digital resonance signal output from the AD converter 15, and outputs a digital signal indicating the phase error.

The feedback control unit 5a performs proportional control and integral control according to the digital signal output from the phase detector 4a to generate a control signal including a digital signal.

The control signal correction unit 7a multiplies environment information including a digital signal by environment dependence coefficient including a digital signal to generate a correction term including a digital signal. In addition, the control signal correction unit 7a adds the correction term including the digital signal to the control signal including the digital signal output from the feedback control to correct the control signal including the digital signal. The variable-frequency oscillator 2a controls the frequency of the digital oscillation signal by multiplying the control signal including the digital signal generated by the control signal correction unit 7a by a frequency conversion coefficient including a digital signal.

In the phase locked loop 1e of FIG. 7, since the variable-frequency oscillator 2a is configured by a digital circuit, the frequency conversion coefficient K does not vary due to the environment information such as a temperature and a power supply voltage. Therefore, even when the resonance frequency of the resonance element 3 changes with time due to a change in environment, the oscillation frequency of the variable-frequency oscillator 2a can be changed with an excellent followability to the resonance frequency.

As described above, considering that the resonance frequency of the resonance element 3 varies due to the environment such as a temperature, the phase locked loop 1 to 1e according to the first embodiment corrects the control signal by adding the correction term according to the environment information to the control signal output from the feedback control unit 5 and controls the oscillation frequency of the variable-frequency oscillator 2 with the corrected control signal. As a result, even when the resonance frequency of the resonance element 3 varies due to the environment such as temperature, the oscillation frequency of the variable-frequency oscillator 2 can be changed with an excellent followability to the variation.

Second Embodiment

The phase locked loop 1 to 1e according to FIGS. 1 to 7 described above can be built in a sensing device that detects a physical quantity. The physical quantity is, for example, a detection target signals of various sensors of an angle, an acceleration, a speed, and the like.

Figure 8:
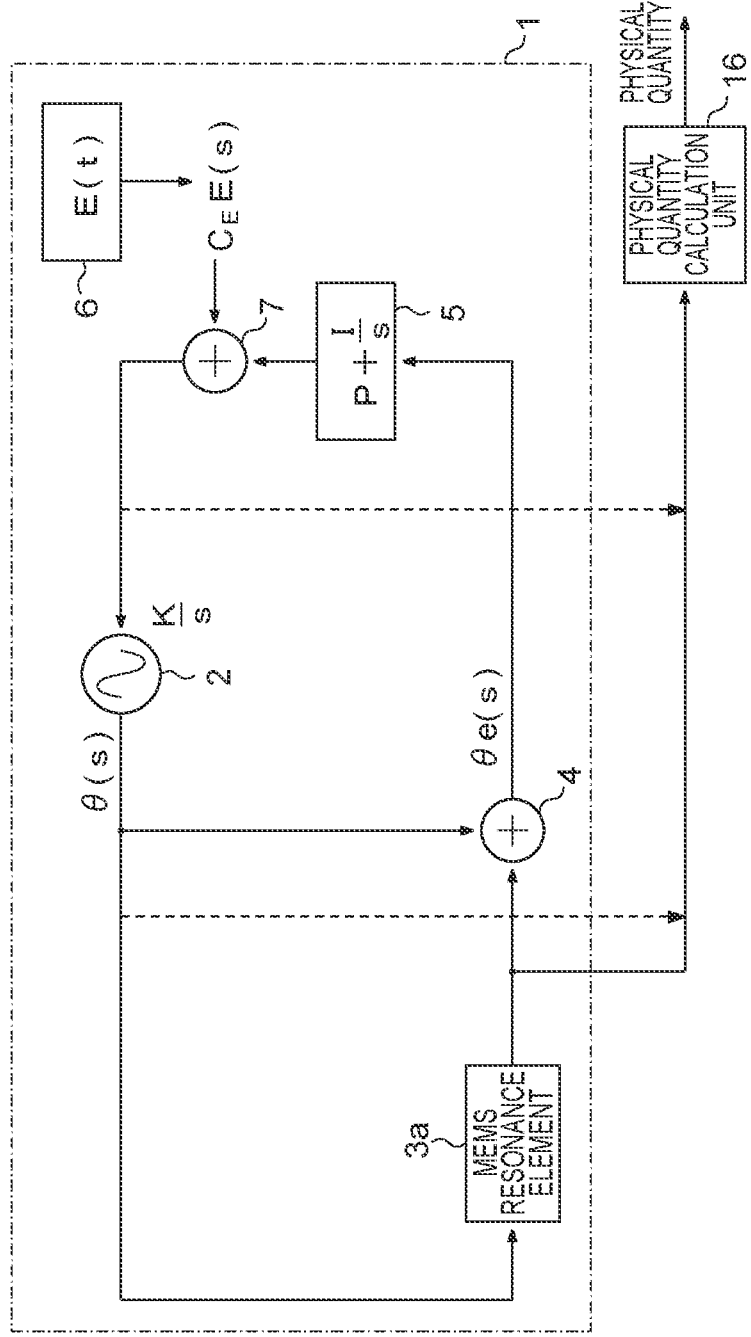
FIG. 8 is a block diagram of a sensing device including the phase locked loop according to the second embodiment.

FIG. 8 is a block diagram of a sensing device 10 including the phase locked loop 1 according to a second embodiment. The sensing device 10 in FIG. 8 includes, for example, the phase locked loop 1 in FIG. 1 and a physical quantity calculation unit 16. Note that the sensing device 10 in FIG. 8 may incorporate the phase locked loop 1a to 1e according to any one of FIGS. 3 to 7. That is, the sensing device 10 in FIG. 8 includes any one of the phase locked loops 1 to 1e described in the first embodiment. Hereinafter, the phase locked loop is representatively referred to as the phase locked loop 1.

The resonance element 3 in the sensing device 10 in FIG. 8 is, for example, a MEMS resonance element 3a. The physical quantity calculation unit 16 detects a physical quantity on the basis of the output signal of the resonance element 3. Note that, as indicated by a broken line in FIG. 8, the physical quantity calculation unit 16 may detect the physical quantity on the basis of the output signal of the variable-frequency oscillator 2, or may detect the physical quantity on the basis of the control signal output from the control signal correction unit 7.

The phase locked loop 1 in the sensing device 10 of FIG. 8 can change the oscillation frequency of the variable-frequency oscillator 2 to the resonance frequency with an excellent followability even when the resonance frequency of the resonance element 3 changes due to the environment information such as a temperature, and thus can more accurately detect the physical quantity without depending on the environment information.

Figure 9:
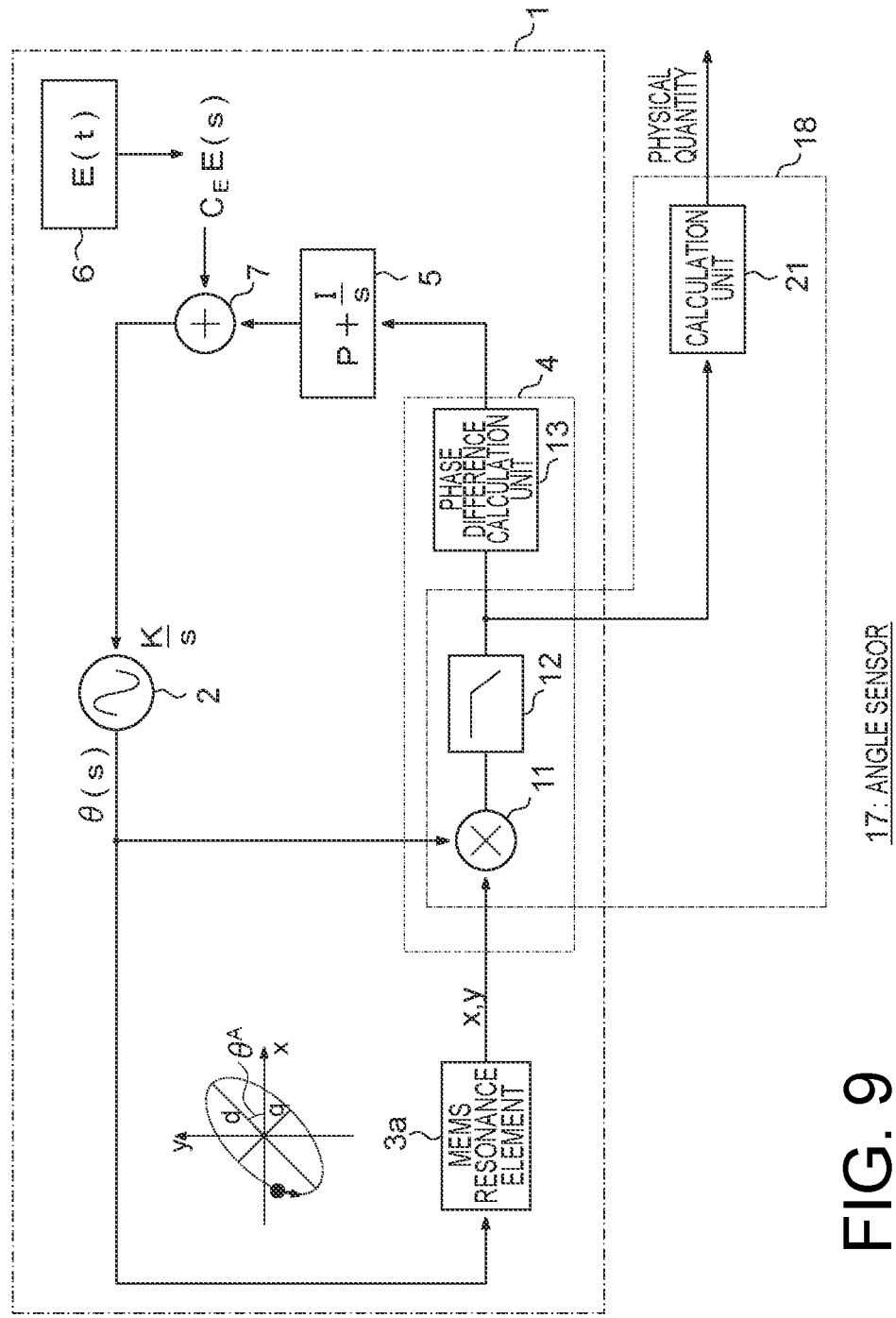
FIG. 9 is a block diagram of an angle sensor having a phase locked loop according to a specific example of FIG. 8.

The sensing device 10 may be, for example, an angle sensor. For example, in a case where the resonance element 3 in the phase locked loop 1 is the MEMS resonance element 3a, the present invention is applicable to an angle sensor. FIG. 9 is a block diagram of an angle sensor 17 including the phase locked loop 1 according to a specific example of FIG. 8. The angle sensor 17 in FIG. 9 includes an angle calculation unit 18 as the physical quantity calculation unit 16 in addition to the phase locked loop 1. The phase locked loop 1 of FIG. 9 has a configuration similar to that of the phase locked loop 1 of FIG. 6, and the resonance element 3 is the MEMS resonance element 3a.

The MEMS resonance element 3a vibrates a mass (weight) into an elliptical shape, the long diameter of the ellipse is defined as d, and the short diameter is defined as q. A displacement signal in the x direction of MEMS resonance element 3a is expressed by Equation (21), and a displacement signal in the y direction is expressed by Equation (22).

$$x = d\cos\theta_A \cos\left(\theta(t) - \frac{\pi}{2} + \theta_e(t)\right) - q\sin\theta_A \sin\left(\theta(t) - \frac{\pi}{2} + \theta_e(t)\right) \quad (21)$$
$$= d\cos\theta_A \sin(\theta(t) + \theta_e(t)) + q\sin\theta_A \cos(\theta(t) + \theta_e(t))$$

$$y = d\sin\theta_A \cos\left(\theta(t) - \frac{\pi}{2} + \theta_e(t)\right) + q\cos\theta_A \sin\left(\theta(t) - \frac{\pi}{2} + \theta_e(t)\right) \quad (22)$$
$$= d\sin\theta_A \sin(\theta(t) + \theta_e(t)) - q\cos\theta_A \cos(\theta(t) + \theta_e(t))$$

The multiplier 11 in the phase detector 4 multiplies the displacement signal in the x direction and the displacement signal in the y direction output from the MEMS resonance element 3a by the oscillation signal (2 sin θ(t), −2 cos θ(t)) input from the variable-frequency oscillator 2 to the phase detector 4 to generate an Ix signal and a Qx signal expressed by following Equation (23) and an Iy signal and a Qy signal expressed by Equation (24).

$$Ix=x(2 \sin \theta(t)), Qx=x(-2 \cos(\theta(t))) \quad (23)$$

$$Iy=y(2 \sin \theta(t)), Qy=y(-2 \cos(\theta(t))) \quad (24)$$

The low-pass filter 12 in the phase detector 4 extracts low-frequency components $Ix_L$, $Qx_L$, $Iy_L$, and $Qy_L$ of the Ix signal, the Qx signal, the Iy signal, and the Qy signal.

The phase difference calculation unit 13 in the phase detector 4 calculates a phase error θe(t) on the basis of following Equation (25).

$$\theta_e(t) = \frac{1}{2}\tan^{-1}\frac{2(I_{xL}Q_{xL} + I_{yL}Q_{yL})}{I_{xL}^2 + I_{yL}^2 - Q_{xL}^2 - Q_{yL}^2} \quad (25)$$

The angle calculation unit 18 in FIG. 9 shares the multiplier 11 and the low-pass filter 12 in the phase detector 4 and includes a calculation unit 21. The output signals $Ix_L$, $Qx_L$, $Iy_L$, and $Qy_L$ of the low-pass filter 12 are also input to the calculation unit 21. The calculation unit 21 obtains an angle $\theta_A(t)$ on the basis of following Equation (26).

$$\theta_A(t) = \frac{1}{2}\tan^{-1}\frac{2(I_{xL}I_{yL} + Q_{xL}Q_{yL})}{I_{xL}^2 + Q_{xL}^2 - I_{yL}^2 - Q_{yL}^2} \quad (26)$$

In the angle sensor 17 of FIG. 9, even when the resonance frequency of the MEMS resonance element 3a changes with time due to the temporal change of the environment information, the oscillation frequency of the variable-frequency oscillator 2 accurately follows the resonance frequency, so that an angle can be detected more accurately.

Figure 10:
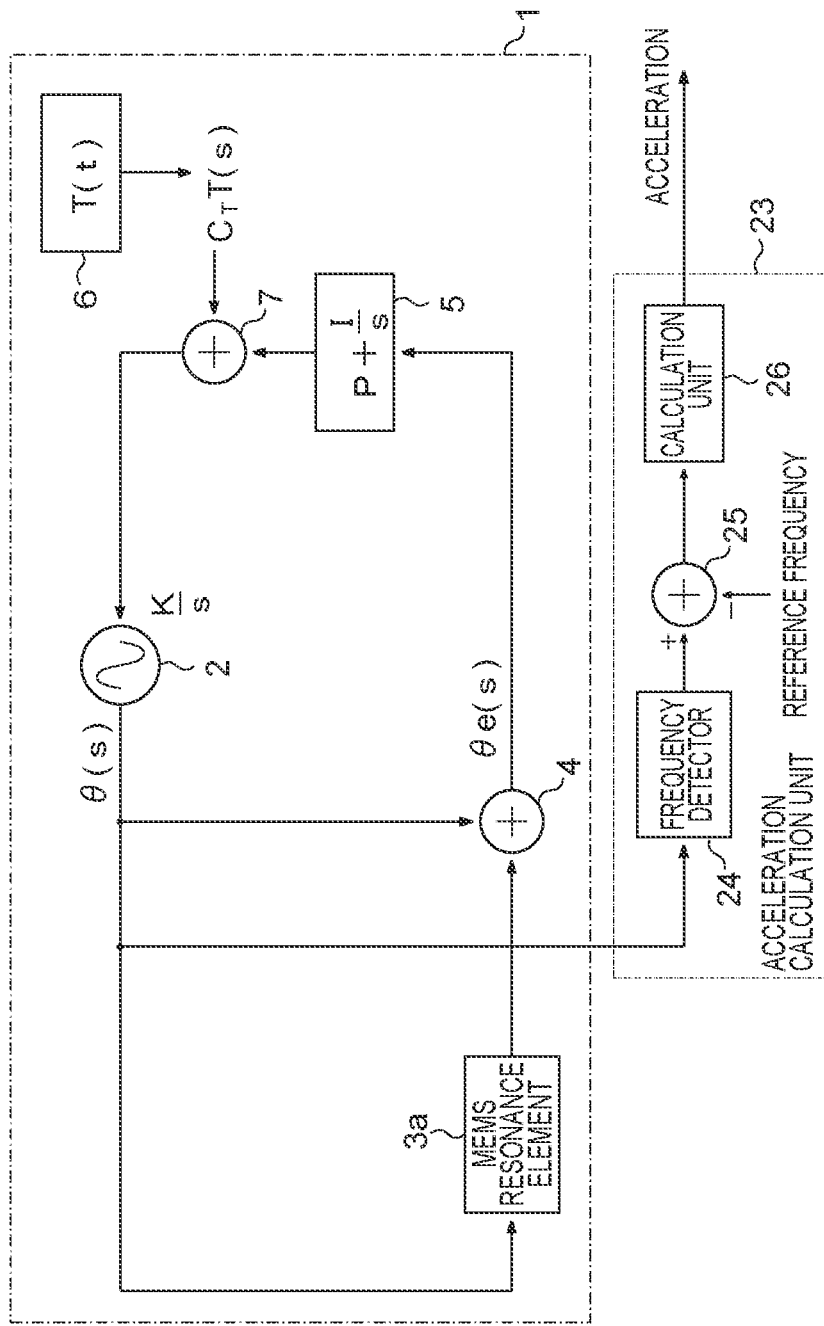
FIG. 10 is a block diagram of an acceleration sensor.

The sensing device 10 in FIG. 8 may be an acceleration sensor. That is, in a case where the resonance element 3 in the phase locked loop 1 is the MEMS resonance element 3a, the present invention is applicable to an acceleration sensor. FIG. 10 is a block diagram of an acceleration sensor 22. The acceleration sensor 22 of FIG. 10 includes the phase locked loop 1 and an acceleration calculation unit 23. The phase locked loop 1 of FIG. 10 has a configuration similar to that of the phase locked loop 1 of FIG. 9, but the control signal correction unit 7 corrects the control signal by adding a value $C_T \cdot T(s)$, which is obtained by multiplying T(s)

obtained by Laplace transforming the temperature information T(t) of the resonance frequency of the resonance element 3 by a predetermined environment dependence coefficient $C_T$, to the control signal output from the feedback control unit 5. As described above, the phase locked loop 1 according to the present embodiment reduces the phase error caused by the environment information different from the physical quantity desired to be obtained, and the acceleration sensor incorporating the phase locked loop 1 reduces the phase error caused by the environment information (for example, temperature information) other than an acceleration.

The acceleration calculation unit 23 in FIG. 10 includes a frequency detector 24, a frequency error detector 25, and a calculation unit 26. The frequency detector 24 detects the oscillation frequency of the output signal of the variable-frequency oscillator 2. The frequency error detector 25 calculates a frequency error between the oscillation frequency detected by the frequency detector 24 and a reference frequency. The reference frequency is the oscillation frequency of the variable-frequency oscillator 2 when the acceleration of the resonance element 3 is set to zero. The calculation unit 26 obtains an acceleration A by dividing the frequency error calculated by the frequency error detector 25 by an acceleration coefficient $K_A$ of the resonance element 3. The acceleration coefficient $K_A$ is a value unique to the MEMS resonance element 3a.

In the acceleration sensor 22 of FIG. 10, even when the resonance frequency of the resonance element 3 changes with time due to the temporal change of the environment, the oscillation frequency of the variable-frequency oscillator 2 changes with accurately following the resonance frequency. Thus, the frequency error calculated by the frequency error detector 25 is not affected by the environment, and the acceleration can be accurately detected.

In the acceleration sensor 22 of FIG. 10, the output signal of the variable-frequency oscillator 2 is input to the acceleration calculation unit 23 to calculate the frequency error between the oscillation frequency and the resonance frequency, but the control signal output from the control signal correction unit 7 may be input to the acceleration calculation unit 23 to calculate the frequency error.

Figure 11:
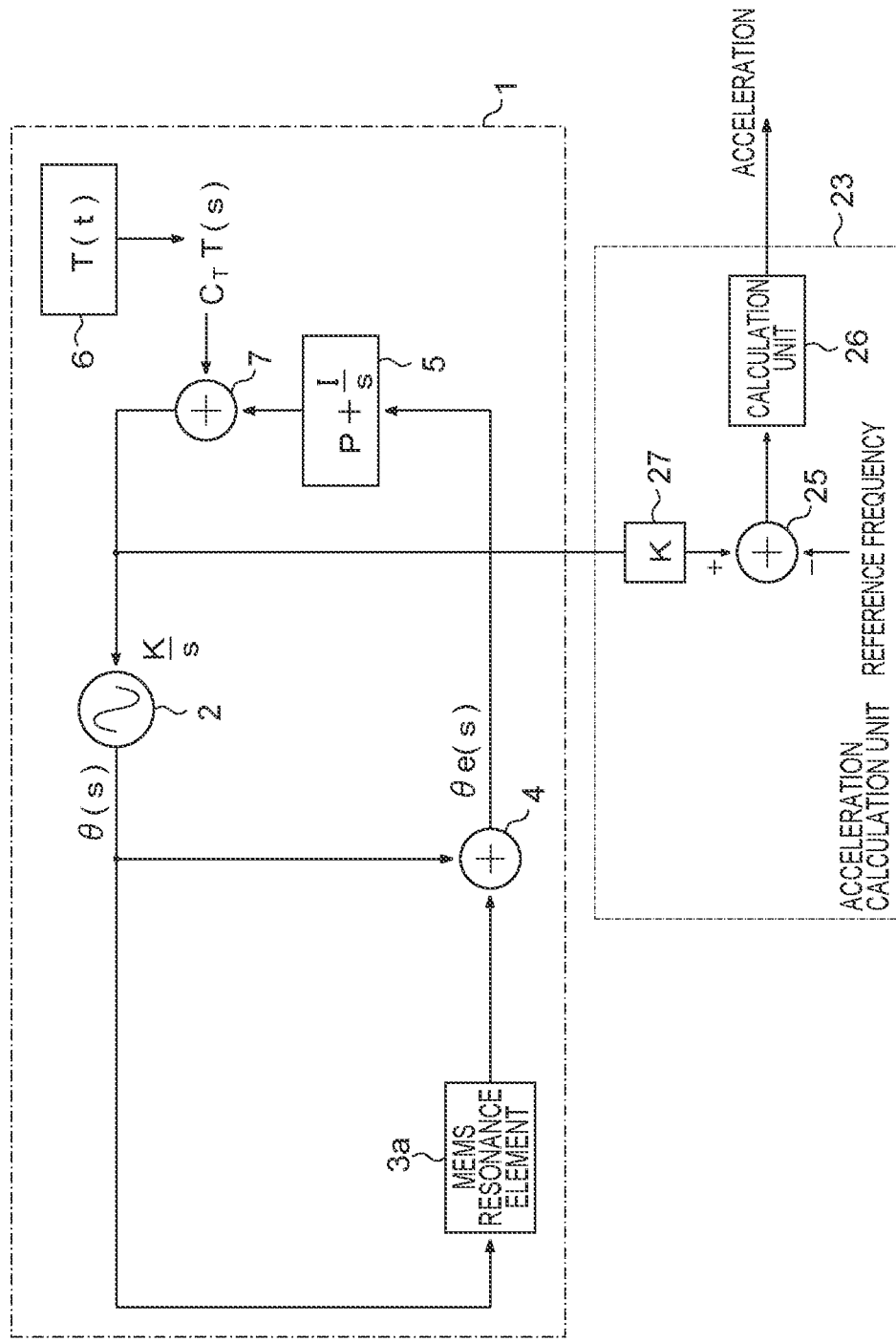
FIG. 11 is a block diagram of an acceleration sensor according to a modification of FIG. 10.

FIG. 11 is a block diagram of an acceleration sensor 22a according to a modification of FIG. 10. The acceleration sensor 22a in FIG. 11 includes the phase locked loop 1 and the acceleration calculation unit 23. The internal configuration of the phase locked loop 1 of FIG. 11 is the same as that of the phase locked loop 1 of FIG. 10.

The acceleration calculation unit 23 in FIG. 11 includes a frequency multiplier 27, the frequency error detector 25, and the calculation unit 26. The frequency multiplier 27 multiplies the control signal output from the control signal correction unit 7 by the frequency conversion coefficient K. As a result, the frequency multiplier 27 can generate an oscillation signal having the same frequency as the variable-frequency oscillator 2. The frequency multiplier 27 has the function of the frequency detector 24 in FIG. 10, and outputs the frequency of the oscillation signal obtained by multiplying the control signal by the frequency conversion coefficient K.

The processing operations of the frequency error detector 25 and the calculation unit 26 in the acceleration calculation unit 23 in FIG. 11 are similar to the processing operations of the frequency error detector 25 and the calculation unit 26 in FIG. 10.

As described above, also in the sensing device 10 of FIG. 11, even when the resonance frequency of the resonance element 3 changes with time according to the environment, the oscillation frequency of the variable-frequency oscillator 2 can be changed according to the resonance frequency, so that an acceleration can be detected without depending on the environment.

The sensing device 10 illustrated in FIGS. 8 to 11 described above performs the feedback control and the detection of the physical quantity by an analog signal, but may perform the feedback control and the detection of the physical quantity by a digital signal.

Figure 12:
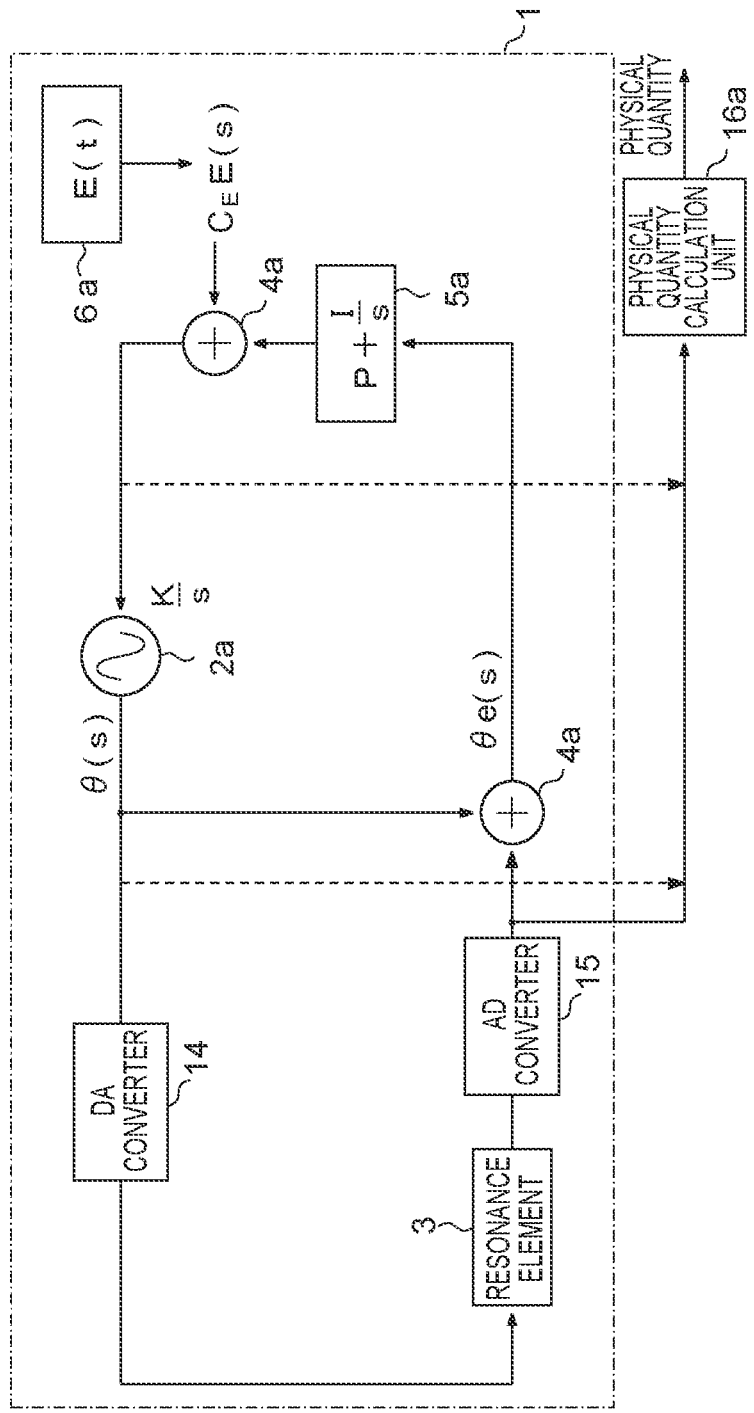
FIG. 12 is a block diagram of a sensing device according to a modification of FIG. 8.

FIG. 12 is a block diagram of a sensing device 10a according to a modification of FIG. 8. The sensing device 10a of FIG. 12 includes the DA converter 14 and the AD converter 15 in addition to the configuration of FIG. 8. In addition, each of the variable-frequency oscillator 2a, the phase detector 4a, the feedback control unit 5a, the control signal correction unit 7a, and a physical quantity calculation unit 16a in FIG. 12 is a digital circuit. Therefore, the variable-frequency oscillator 2a, the phase detector 4a, the feedback control unit 5a, and the control signal correction unit 7a can perform processing operations without depending on the environment such as a temperature.

The DA converter 14 converts the digital oscillation signal output from the variable-frequency oscillator 2a into an analog oscillation signal. Similarly to the resonance element 3 in FIG. 8, the resonance element 3 is an analog circuit, and performs a resonance operation when the oscillation frequency of the oscillation signal is a resonance frequency. The resonance element 3 is, for example, the MEMS resonance element 3a.

The AD converter 15 converts the output signal of the resonance element 3 into a digital signal. The output signal of the AD converter 15 is supplied to the phase detector 4a and the physical quantity calculation unit 16a.

As described above, by configuring the components other than the resonance element 3 in the sensing device 10, 10a by digital circuits, it is possible to suppress the variation of the frequency conversion coefficient K of the variable-frequency oscillator 2 due to a temperature, a power supply voltage, and the like. Therefore, even when the resonance frequency of the resonance element 3 changes with time due to a change in environment such as a temperature or a power supply voltage, the oscillation frequency of the variable-frequency oscillator 2 can be varied with accurately following the resonance frequency.

Since the physical quantity calculation unit 16 can be configured by a digital circuit, the physical quantity can be detected more accurately without being affected by the environment such as a temperature and a power supply voltage as compared with a case where the physical quantity calculation unit is configured by an analog circuit.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A phase locked loop comprising:
an oscillator that varies a frequency according to a control signal;

a resonance element that resonates at a predetermined resonance frequency and output a signal obtained by shifting a phase of an output signal of the oscillator by 90 degrees at the resonance frequency;

a phase detector that detects a phase error between an output signal of the resonance element and an output signal of the oscillator;

a feedback controller that controls a frequency of an output signal of the oscillator by proportional control and integral control according to the phase error; and a control signal corrector that corrects the control signal by adding a correction term corresponding to environment information to an output signal of the feedback controller.

2. The phase locked loop according to claim 1, wherein
the resonance frequency of the resonance element changes according to an environment information coefficient corresponding to the environment information, and the control signal corrector corrects the control signal by adding, to an output signal of the feedback controller, the correction term based on a value obtained by multiplying the environment information that changes with time by an environment dependence coefficient unique to the environment information.

3. The phase locked loop according to claim 2, wherein
the oscillator sets a frequency of an output signal by multiplying the control signal by a frequency conversion coefficient unique to the oscillator, and the control signal corrector corrects the control signal by adding, to an output signal of the feedback controller, the correction term based on a value obtained by dividing a value, which is obtained by multiplying the environment information that changes with time by the environment dependence coefficient unique to the environment information, by the frequency conversion coefficient.

4. The phase locked loop according to claim 2, wherein
the environment information includes temperature information that changes with time, the environment information coefficient includes a temperature coefficient unique to the resonance element, the resonance frequency of the resonance element changes according to the temperature information and the temperature coefficient, and the control signal corrector corrects the control signal by adding, to the output signal of the feedback controller, the correction term based on a value obtained by multiplying the temperature information by the environment dependence coefficient unique to the temperature information.

5. The phase locked loop according to claim 2, wherein
the environment information includes acceleration information, the environment information coefficient includes an acceleration coefficient unique to the resonance element, the resonance frequency of the resonance element is changed by the acceleration coefficient, and the control signal corrector corrects the control signal by adding, to the output signal of the feedback controller, the correction term based on a value obtained by multiplying the acceleration information by the environment dependence coefficient unique to the acceleration information.

6. The phase locked loop according to claim 1, wherein
the oscillator outputs a first oscillation signal and a second oscillation signal having a same frequency as the first oscillation signal and having a phase shifted by 90 degrees from a phase of the first oscillation signal, the resonance element outputs a signal obtained by shifting the phase of the first oscillation signal by 90 degrees at the resonance frequency, and the phase detector detects the phase error between the output signal of the resonance element and the second oscillation signal.

7. The phase locked loop according to claim 1, wherein
the oscillator outputs an oscillation signal having a frequency corresponding to the control signal, the resonance element outputs a signal obtained by shifting a phase of the oscillation signal by 90 degrees at the resonance frequency, and the phase detector comprises a multiplier that multiplies the oscillation signal by an output signal of the resonance element, and a filter that extracts, as the phase error, a signal of a low-frequency component included in a multiplication result signal of the multiplier.

8. The phase locked loop according to claim 1, wherein
the oscillator outputs a first oscillation signal, a second oscillation signal obtained by shifting a phase of the first oscillation signal by 90 degrees, and a third oscillation signal obtained by shifting a phase of the second oscillation signal by 90 degrees, the resonance element outputs a signal obtained by shifting the phase of the first oscillation signal by 90 degrees at the resonance frequency, and the phase detector comprises a multiplier that multiplies the second oscillation signal by the output signal of the resonance element and multiplies the third oscillation signal by the output signal of the resonance element, a filter that extracts a first signal of a low-frequency component included in a signal obtained by multiplying the second oscillation signal by the output signal of the resonance element and a second signal of a low-frequency component included in a signal obtained by multiplying the third oscillation signal by the output signal of the resonance element, and a phase difference calculator that calculates the phase error on the basis of the first signal and the second signal.

9. The phase locked loop according to claim 1, wherein
the resonance element is a micro electro mechanical systems (MEMS) resonance element, and the MEMS resonance element vibrates at the resonance frequency in a two-dimensional direction.

10. The phase locked loop according to claim 1, wherein
the MEMS resonance element outputs a displacement signal in a first direction and a displacement signal in a second direction, and the phase detector detects, as the phase error, a low-frequency component of a signal obtained by multiplying the output signal of the oscillator by the displacement signal in the first direction, and detects, as the phase error, a low-frequency component of a signal obtained by multiplying the output signal of the oscillator by the displacement signal in the second direction.

11. The phase locked loop according to claim 1, wherein
the oscillator, the phase detector, the feedback controller, and the control signal corrector are digital circuits,
the resonance element is an analog circuit, and
an output signal of the oscillator, an output signal of the feedback controller, the environment information, and the control signal generated by the control signal corrector are digital signals.

12. The phase locked loop according to claim 11, further comprising:
a DA converter that converts a first digital signal output from the oscillator into an analog oscillation signal to be input to the resonance element; and
an AD converter that converts the output signal of the resonance element into a second digital signal, wherein
the phase detector generates a third digital signal representing the phase error on the basis of the first digital signal and the second digital signal,
the feedback controller performs proportional control and integral control according to the third digital signal to generate a fourth digital signal,
the control signal corrector adds a fifth digital signal corresponding to the correction term and the fourth digital signal to generate a sixth digital signal corresponding to the control signal, and
the oscillator varies a frequency of the first digital signal according to the sixth digital signal.

13. The phase locked loop according to claim 12, wherein
the oscillator varies the frequency of the first digital signal according to the sixth digital signal without depending on the environment information.

14. A sensing device comprising:
a phase locked loop; and
a physical quantity calculator, wherein
the phase locked loop comprises
an oscillator that varies a frequency according to a control signal,
a resonance element that resonates at a predetermined resonance frequency and output a signal obtained by shifting a phase of an output signal of the oscillator by 90 degrees at the resonance frequency,
a phase detector that detects a phase error between an output signal of the resonance element and an output signal of the oscillator,
a feedback controller that controls a frequency of an output signal of the oscillator by proportional control and integral control according to the phase error, and
a control signal corrector that corrects the control signal by adding a correction term corresponding to environment information to an output signal of the feedback controller, and
the physical quantity calculator calculates a physical quantity on the basis of at least one of the output signal of the resonance element, the output signal of the oscillator, or the control signal.

15. The sensing device according to claim 14, wherein
the resonance element is a micro electro mechanical systems (MEMS) resonance element,
the MEMS resonance element vibrates at the resonance frequency in a two-dimensional direction to output a displacement signal in a first direction and a displacement signal in a second direction,
the phase detector detects, as the phase error, a low-frequency component of a signal obtained by multiplying the output signal of the oscillator by the displacement signal in the first direction, and detects, as the phase error, a low-frequency component of a signal obtained by multiplying the output signal of the oscillator by the displacement signal in the second direction, and
the physical quantity calculator calculates the physical quantity on the basis of the phase error detected by the phase detector.

16. The sensing device according to claim 14, further comprising:
a frequency detector that detects a frequency of the output signal of the oscillator; and
a frequency error detector that detects a frequency error between the frequency detected by the frequency detector and a reference frequency when an acceleration is zero, wherein
the physical quantity calculator detects the physical quantity including an acceleration on the basis of the frequency error detected by the frequency error detector.

17. The sensing device according to claim 14, further comprising:
a multiplier that multiplies the control signal by a frequency conversion coefficient unique to the oscillator; and
a frequency error detector that detects a frequency error between an output signal of the multiplier and a reference frequency when an acceleration is zero, wherein
the physical quantity calculator detects the physical quantity including an acceleration on the basis of the frequency error detected by the frequency error detector.

18. The sensing device according to claim 17, wherein
the physical quantity calculator obtains the acceleration by dividing the frequency error detected by the frequency error detector by an acceleration coefficient unique to the resonance element.

19. The sensing device according to claim 14, wherein
the oscillator, the phase detector, the feedback controller, the control signal corrector, and the physical quantity calculator are digital circuits,
the resonance element is an analog circuit, and
an output signal of the oscillator, an output signal of the feedback controller, the environment information, the control signal generated by the control signal corrector, and the physical quantity calculated by the physical quantity calculator are digital signals.

20. The sensing device according to claim 19, further comprising:
a DA converter that converts a first digital signal output from the oscillator into an analog oscillation signal to be input to the resonance element; and
an AD converter that converts an output signal of the resonance element into a second digital signal, wherein
the phase detector generates a third digital signal representing the phase error on the basis of the first digital signal and the second digital signal,
the feedback controller performs proportional control and integral control according to the third digital signal to generate a fourth digital signal,
the control signal corrector adds a fifth digital signal corresponding to the correction term and the fourth digital signal to generate a sixth digital signal corresponding to the control signal,
the oscillator varies a frequency of the first digital signal according to the sixth digital signal, and
the physical quantity calculator calculates the physical quantity on the basis of at least one of the first digital signal, the second digital signal, or the sixth digital signal.

* * * * *